(12) United States Patent
Morigaki et al.

(10) Patent No.: US 6,808,865 B1
(45) Date of Patent: Oct. 26, 2004

(54) PHOTOSENSITIVE RESIN COMPOSITION OF AQUEOUS EMULSION TYPE

(75) Inventors: Toshio Morigaki, Uji (JP); Masatami Matsumoto, Uji (JP)

(73) Assignee: Goo Chemical Co., Ltd., Kyoto (JP)

( * ) Notice: Subject to any disclaimer, the term of this patent is extended or adjusted under 35 U.S.C. 154(b) by 111 days.

(21) Appl. No.: 09/926,561

(22) PCT Filed: Jun. 7, 2000

(86) PCT No.: PCT/JP00/03698

§ 371 (c)(1),
(2), (4) Date: Nov. 19, 2001

(87) PCT Pub. No.: WO00/75235

PCT Pub. Date: Dec. 14, 2000

(30) Foreign Application Priority Data

| Jun. 7, 1999 | (JP) | ................................ 11/158890 |
| Jun. 7, 1999 | (JP) | ................................ 11/158920 |
| Jun. 9, 1999 | (JP) | ................................ 11/163097 |

(51) Int. Cl.$^7$ ................................ G03F 0/32; G03F 7/027; C08L 101/06

(52) U.S. Cl. ................................ 430/280.1; 430/283.1; 430/909; 430/911; 430/308; 430/318; 430/311; 430/18; 522/84

(58) Field of Search ................ 430/280.1, 283.1, 430/909, 911, 308, 318, 311, 18; 522/84

(56) References Cited

U.S. PATENT DOCUMENTS

| 2,791,504 | A | * | 5/1957 | Plambeck | ................ 430/276.1 |
| 3,853,561 | A | * | 12/1974 | Reichel et al. | ............. 430/308 |
| 5,821,031 | A | * | 10/1998 | Hashimoto et al. | ...... 430/280.1 |
| 6,238,841 | B1 | * | 5/2001 | Morigaki | ................ 430/280.1 |

FOREIGN PATENT DOCUMENTS

| EP | 249306 A2 | * | 12/1987 | ............. C08F/8/30 |
| EP | 942328 A1 | * | 9/1999 | ........... G03F/7/033 |
| JP | 54-135526 A | * | 10/1979 | ............. G03F/7/12 |
| JP | 2000122281 A | * | 4/2000 | ........... G03F/7/027 |

OTHER PUBLICATIONS

JP02000122281 A, copyright 2000, JPO, English abstract of JP 2000–122281–A.*
PTO 03–3597 which is an English Translation of Higuchi, JP 54–135526 A with an issue date of Oct. 20, 1979 by FLS, Inc 12 pages, United States Patent and Trademark Office, Washington, D.C. Jun. 2003.*
JP020001122281 A, copyrignt 2000, JPO, English abstract of JP 2000–122281–A.*
Derwent–Acc–No.: 2000–370923, copyright 1999, Derwent Information Ltd, English Abstract of JP 2000–122281–A.*
132:315842, CA, copyright 2003, ACS, English Abstract of JP 2000–122281 A.*

* cited by examiner

Primary Examiner—Cynthia Hamilton
(74) Attorney, Agent, or Firm—Westerman, Hattori, Daniels & Adrian, LLP

(57) ABSTRACT

Present invention provides an aqueous emulsion type photosensitive resin composition which forms a cured film significantly superior in water and solvent resistances in comparison with the conventional aqueous emulsion type photosensitive resin compositions. This photosensitive resin composition contains (A) an emulsion of a photosensitive water-insoluble polymer, the emulsion being obtained by reacting (i) an aqueous polymer emulsion whose main ingredient is a water-insoluble polymer and which contains a polymer having a hydroxyl group with (ii) an N-alkylol (meth)acrylamide, (B) a compound having a photoreactive ethylenically unsaturated group, and (C) a photopolymerization initiator.

8 Claims, No Drawings

PHOTOSENSITIVE RESIN COMPOSITION OF AQUEOUS EMULSION TYPE

TECHNICAL FIELD

The present invention relates to a photosensitive resin composition of aqueous emulsion type.

More particularly, the present invention relates to a photosensitive resin composition of aqueous emulsion type which are developable with water or a dilute aqueous alkaline solution and are useful particularly as photoresist ink for manufacturing printed wiring boards.

Moreover, the present invention relates to a photosensitive resin composition which has a good sensitivity and a water and solvent resistance. The present photosensitive resin composition is useful for screen printing stencil and photosensitive printing ink. The composition is also useful for etching resist, plating resist ink and solder resist ink for manufacturing printed wiring boards.

BACKGROUND ART

A photoresist ink developable with a dilute aqueous alkaline solution requires no use to solvent to develop. Such kind of ink is superior to develop with industrial safety, and with prevention of environmental pollution or fire. Therefore, in recent years, they have been often used in the fields of ink for manufacturing printed wiring boards, ink for carving gravure rolls, ink for manufacturing color filter pixels, photosensitive composition for manufacturing screen printing stencils and ink for manufacturing color filter protective coatings. Conventional photoresist ink developable with a dilute aqueous alkaline solution includes a photosensitive resin composition such as those disclosed in JP-A 5-224413 and JP-A 5-241340, for example.

However, the above mentioned photoresist ink developable with a dilute aqueous alkaline solution generally has some ingredients which are dissolved or dispersed in various kinds of organic solvents so that the ink of the ingredients is uniformly applied to the surface of a substrate and then subjected to an exposure and to transfer to the next development process. Therefore, it is necessary to vaporize the organic solvent by predrying before exposure. Thus, the use of an organic solvent causes a problem of industrial safety, environmental pollution, fire control and so on, which is remained unsettled in the process of forming a predried film after its application to a substrate.

Accordingly, there is an object of the present invention to be solved to provide a photosensitive resin composition of aqueous emulsion type which can reduce a problem relating to industrial safety, environmental pollution, fire control and so on accompanied by use of an organic solvent in the process of forming a predried film after its application to a substrate. The photosensitive resin composition according to the present invention is useful as a photoresist ink for manufacturing printed wiring boards such as etching resist ink, plating resist ink, solder resist ink and marking ink, a photoresist ink for carving gravure rolls, an ink for manufacturing color filter pixels, a photosensitive composition for manufacturing screen printing stencils, an ink for manufacturing color filter protective coatings and so on and is developable with water or a dilute aqueous alkaline solution.

Furthermore, there has been known a photosensitive resin composition of aqueous emulsion type used widely for manufacturing a screen printing stencil.

Such a known photosensitive resin composition for manufacturing a screen printing stencil includes a composition comprising a diazo resin as photocrosslinking agent, polyvinyl alcohol, a polyvinyl acetate emulsion and so on (see JP-A 53-51004), a composition comprising a water-soluble photosensitive polymer obtained by adding N-methylol (meth)acrylamide to polyvinyl alcohol (see JP-B 49-5923), a composition obtained,by adding an ethylenically unsaturated compound and a photopolymerization initiator to an emulsion of polyvinyl alcohol or polyvinyl acetate having styrylpyridinium or styrylquinolinium group (see JP-A 60-10245).

The above mentioned photosensitive resin composition of aqueous emulsion type for screen printing may be changed into a cured film having a certain water resistance or a solvent resistance. However, in order to produce a screen printing stencil with greater durability, it is demanded that a photosensitive resin composition can be changed into a cured film having greater water resistance and greater solvent resistance.

Accordingly, there is another object to the present invention to be solved to provide a novel photosensitive resin composition of aqueous emulsion type capable of forming a cured film having extremely excellent water and solvent resistances in comparison with conventional photosensitive resin compositions of aqueous emulsion type.

SUMMARY OF THE INVENTION

The above mentioned objects are solved to provide an aqueous emulsion type photosensitive resin composition comprising:

(A) an emulsion of a photosensitive water-insoluble polymer, the emulsion being obtained by reacting (i) an aqueous polymer emulsion which contains a water-insoluble polymer as its main component and which contains a polymer having a hydroxyl group with (ii) an N-alkylol(meth)acrylamide;

(B) a compound having a photoreactive ethylenically unsaturated group; and (C) a photopolymerization initiator.

In this specification, "(meth)acrylic-" means "acrylic-" and/or "methacrylic-". For example, (meth)acrylic acid means acrylic acid and/or methacrylic acid, and (meth) acrylamide means acrylamide and/or methacrylamide.

PREFERRED EMBODIMENT OF THE INVENTION

The following is a more detailed explanation on ingredients contained in the present invention, and preferred embodiment of the present invention.

Ingredient (A)

Ingredient (A) is a photosensitive water-insoluble polymer emulsion. The emulsion is obtained by reacting (i) an aqueous polymer emulsion which contains a water-insoluble polymer as its main component and which contains a polymer having a hydroxyl group with (ii) an N-alkylol (meth)acrylamide.

The aqueous polymer emulsion (i) in the above mentioned ingredient (A) may be of one kind of polymer or two or more kinds of polymers. This aqueous polymer emulsion comprises a water-insoluble polymer as its main component. Furthermore, at least one polymer contained in this aqueous polymer emulsion has a hydroxyl group. The polymer having a hydroxyl group may be either a water-soluble polymer or a water-insoluble polymer.

The polymer having a hydroxyl group is only required to be contained in at least a part of the aqueous polymer emulsion. Accordingly, when the aqueous polymer emulsion is only of a water-insoluble polymer, hydroxyl groups must be attached to the water-insoluble polymer. On the other hand, in case where the aqueous polymer emulsion is of a mixture of a water-insoluble and a water-soluble polymers, the hydroxyl group may be attached to either of the polymers.

Typical aqueous polymer emulsions contain both a protective colloid of a polymer having a hydroxyl group and a water-insoluble polymer.

Illustrative monomer components for obtaining a water-insoluble polymer without having a hydroxyl group may include styrene, (meth)acrylonitrile, vinyl acetate, vinyl chloride, unsaturated polybasic acids (for example, itaconic acid, maleic anhydride and the like), α-olefins (for example, isobutene and the like), dienes (for example, butadiene and the like), acrylic acids (for example, acrylic acid, methacrylic acid and the like), vinyl ethers (for example, ethyl vinyl ether and the like), acrylic esters (for example, butyl acrylate, hydroxypropyl acrylate and the like), methacrylic esters (for example, methyl methacrylate, β-hydroxyethyl methacrylate and the like) and (meth)acrylamides (for example, methacrylamide and diacetone acrylamide and the like). Each of the monomers may be polymerized alone or in combination, to obtain a water-insoluble polymer without having a hydroxyl group.

Also, illustrative monomer components for obtaining a water-insoluble polymer having a hydroxyl group may include partially saponified vinyl acetate and hydroxyl group-containing (meth)acrylates such as 2-hydroxyethyl (meth)acrylate, polyethylene glycol mono(meth)acrylate, hydroxypropyl (meth)acrylate and polypropylene polyethylene glycol mono(meth)acrylate. Each of the monomers may be polymerized alone, in combination with another monomer, or in combination with a monomer for producing the aforesaid water-insoluble polymer without a hydroxyl group, to thereby obtain a water-insoluble polymer having a hydroxyl group.

Thusly obtained water-insoluble polymer is used to produce the aqueous polymer emulsion of the present invention, for example, by using a protective colloid, but not to be limited. Such a protective colloid may include cellulose derivatives such as carboxymethyl cellulose, hydroxypropylmethyl cellulose, hydroxyethyl cellulose and hydroxypropyl cellulose; sodium alginate and its derivatives; polyvinyl alcohol based polymers such as polyvinyl alcohols obtained by complete or partial saponification of polyvinyl acetate; water-soluble polyvinyl alcohol derivatives obtained by reacting an acid anhydride-containing compound, carboxyl group-containing compound, epoxy group-containing compound or aldehyde group-containing compound, and the like with an —OH or —OCOCH$_3$ group of polyvinyl alcohol based polymer such as polyvinyl alcohol obtained by partially or completely saponifying polyvinyl acetate and a completely or partially saponified polyvinyl alcohol, and polyvinyl alcohol based copolymers having a vinyl alcohol unit which is obtained by partially or completely saponifying a polyvinyl acetate portion, using (meth)acrylic acid, (meth)acrylamide, N-methylol(meth) acrylamide, styrene, ethylene, propylene, maleic anhydride, (meth)acrylonitrile, (meth)acrylates as a copolymer component of vinyl acetate.

Among these protective colloids, polyvinyl alcohol, water-soluble polyvinyl alcohol derivative, vinyl alcohol based copolymer having a vinyl alcohol unit obtained by partially or completely saponifying polyvinyl acetate portion are particularly preferred because they have a hydroxyl group and each of the resulting water-insoluble polymers exhibits good dispersibility.

In the case of using such a protective colloid, the water-insoluble polymer emulsion as the ingredient (i) may be obtained by subjecting a monomer component for producing a water-insoluble polymer to emulsion or suspension polymerization in a system containing the protective colloid, or by first of all preparing a water-insoluble polymer and then dispersing with the protective colloid.

In case of using a protective colloid, the amount of the protective colloid to be incorporated is not particularly limited, but it is preferably incorporated in an amount of 1–100 parts by weight, more preferably 5–40 parts by weight, per 100 parts of the solid in the water-insoluble polymer, which is taken into consideration of the balance between dispersion stability of the photosensitive water-insoluble polymer emulsion (A) and water resistance of a cured film.

Thusly obtained aqueous polymer emulsion is then reacted with N-alkylol(meth)acrylamide to obtain a photosensitive water-insoluble polymer emulsion as the ingredient (A).

The method for reacting the hydroxyl group in the water-insoluble polymer emulsion as the ingredient (A) (i) with the alkylol group in N-alkylol(meth)acrylamide as the indredient (A) (ii) is not particularly limited. The reaction can be easily carried out by conventional methods of adding an acidic catalyst such as inorganic acid, sulfonic acid derivative and ammonium halide into a water-insoluble polymer emulsion and then heating. Furthermore, it is preferable to use, an N-alkylol(meth)acrylamide, in which. alkylol has 1–5 carbon atoms, and in particular, it is preferable to use an N-methylol(meth)acrylamide, which is available at a relatively low price.

The quantity of the unsaturated double bond introduced by N-alkylol(meth)acrylamide is preferably 0.01–5 moles, more preferably 0.1–2 moles, per 1.0 kg of a solid of the photosensitive water-insoluble polymer emulsion (A). In such ranges, the best balance between water and solvent resistances of a cured film of the photosensitive resin composition of aqueous emulsion type may be achieved.

Ingredient (B)

The photosensitive resin composition of the present invention contains a compound having a photoreactive ethylenically unsaturated group as the ingredient (B). Illustrative compound as the ingredient (B) may be included in a compound having at least one photoreactive ethylenically unsaturated group such as acryloyl group, methacryloyl group, allyl group, vinyl ether group, acrylamide group, methacrylamide group and the like.

The specific compound as the ingredient (B) may include an ethylenically unsaturated monomer such as trimethylolpropane tri(meth)acrylate, pentaerythritol tri(meth)acrylate, pentaerythritol tetra(meth)acrylate, dipentaerythritol penta (meth)acrylate, dipentaerythritol hexa(meth)acrylate, 1,4-butanediol diacrylate, 1,6-hexanediol di(meth)acrylate neopentyl glycol di(meth)acrylate, tripropylene glycol di(meth) acrylate, 2,2-bis[4-((meth)acryloxyethoxy)phenyl]propane, 2,2-bis[4-((meth)acryloxydiethoxy)phenyl]propane, 2-hydroxy-1,3-di(meth)acryloxypropane, ethylene glycol di(meth)acrylate, diethylene glycol di(meth)acrylate, triethylene glycol di(meth)acrylate, phenoxyethyl (meth)acrylate, phenoxydiethylene glycol (meth)acrylate, methoxydiethylene glycol (meth)acrylate, tetrahydrofurfuryl (meth) acrylate, dicyclopentenyloxyethyl (meth)acrylate, 1-methoxycyclododecadienyl (meth)acrylate, β-(meth) acryloyloxyethyl hydrogen phthalate, β-(meth) acryloyloxyethyl hydrogen succinate, 3-chloro-2-hydroxypropyl (meth)acrylate, triallyl isocyanurate, methoxyethyl vinyl ether, tert-butyl vinyl ether, lauryl (meth)acrylate, 2-ethylhexyl (meth)acrylate, isodecyl (meth)acrylate, stearyl (meth)acrylate, benzyl (meth) acrylate, bisphenol A-diepoxyacrylic acid adducts, reaction products of tolylenediisocyanate and 2-hydroxypropyl (meth)acrylate, reaction products of phenyl isocyanurate and 2-hydroxyethyl (meth)acrylate, glycol ester of maleic acid, (meth)acrylamide, N-methoxymethyl(meth)acrylamide, N,N-dimethyl(meth)acrylamide, (meth)acryloylmorpholine, N-methylol(meth)acrylamide, hydroxypropyl (meth) acrylate, polyethylene glycol di(meth)acrylate, methylenebis(meth)acrylamide, 2-hydroxyethyl (meth) acrylate and 2,2-bis[4-methacryloyloxypolyethoxyphenyl] propane. At least one compound selected from these compounds having a photoreactive ethylenically unsaturated group may be used.

The photosensitive composition of the present invention may contain (b) a compound having at least one carboxyl group and at least one photoreactive ethylenically unsaturated group in its molecule as the ingredient (B). The carboxyl group in compound (b) may be neutralized with an organic basic compound such as alkanolamines, and an inorganic basic compound such as alkaline metal hydroxides, ammonia and the like as long as the effect of the present invention is obtained.

By incorporating the compound (b), the etching resistance of a cured film can be improved when the composition of the present invention is used as an etching resist ink. Furthermore, the incorporation of a sufficient amount of (b) renders the cured film of the photosensitive resin composition of aqueous emulsion type of the present invention easily removable even with an aqueous alkaline solution such as aqueous solutions of alkaline metal hydroxides. This characteristic is useful for reusing a screen printing stencil and final removing of cured films of an etching resist ink. In order to impart such a characteristic, it is desirable to incorporate compound (b) such that its amount becomes 50–100% by weight relative to the total amount of compound (B). Moreover, in some cases, a cured product of the composition of the present invention can be removed with sodium periodate and the like.

This compound (b) is not particularly restricted, but is exemplified by a compound (b1) that is a partially esterified product of a compound having one hydroxyl group and one photoreactive ethylenically unsaturated group in its molecule with a polycarboxylic acid and a compound (b2) that is a partially esterified product of a compound having one epoxy group and one ethylenically unsaturated group with a polycarboxylic acid.

The compound (b1) can be obtained, for example, by reacting a compound having one hydroxyl group and one photoreactive ethylenically unsaturated group in its molecule with a polycarboxylic anhydride. The compound (b2) can be obtained, for example, by reacting a compound having only one epoxy group and only one ethylenically unsaturated group with a polycarboxylic acid.

Illustrative compound as mentioned above may include 2-(meth)acryloyloxyethylsuccinic acid, 2-(meth)acryloyloxyethylphthalic acid, 2-(meth)acryloyloxyethyltetrahydrophthalic acid and 2-(meth)acryloyloxyethylhexahydrophthalic acid.

The aforesaid polycarboxylic acid is exemplified by succinic acid, phthalic acid, maleic acid, trimellitic acid, pyromellitic acid, tetrahydrophthalic acid, 3-methyltetrahydrophthalic acid, 4-methyltetrahydrophthalic acid, 4-ethyltetrahydrophthalic acid, hexahydrophthalic acid, 3-methylhexahydrophthalic acid, 4-methylhexahydrophthalic acid, 3-ethylhexahydrophthalic acid and 4-ethylhexahydrophthalic acid. These polycarboxylic acids can be used alone or in appropriate combination of two or more of them. Furthermore, as a polycarboxylic acid, anhydrides of the above listed polycarboxylic acids can also be used.

The compound having one hydroxyl group and one photoreactive ethylenically unsaturated group in its molecule in the aforesaid (b1) may include 2-hydroxyethyl (meth)acrylate, 2-hydroxypropyl (meth)acrylate, 2-hydroxybutyl (meth)acrylate, polyethylene glycol (meth)acrylate, polypropylene glycol mono(meth)acrylate and polybutylene glycol (meth)acrylate, and polycaprolactone mono(meth)acrylate. These can be used alone or in appropriate combination.

The compound having only one epoxy group and only one ethylenically unsaturated group in the aforesaid (b2) may include glycidyl (meth)acrylates such as glycidyl (meth)acrylate and 2-methylglycidyl (meth)acrylate, epoxycyclohexyl derivatives of (meth)acrylic acid such as (3,4-epoxycyclohexyl)methyl (meth)acrylate. These can be used alone or in appropriate combination of two or more of them.

Ingredient (C)

Furthermore, the photosensitive resin composition of the present invention contains a photopolymerization initiator as ingredient (C). Such an ingredient is exemplified by benzoyl alkyl ether, Michler's ketone, di-tert-butylperoxide, tribromoacetophenone, and in addition, substances that easily generate radicals under light irradiation such as anthraquinone derivatives e.g. tert-butylanthraquinone, thioxanthone derivatives e.g. chlorothioxanthone. Also, a photopolymerization initiator for loser radiation may be used. One of these compounds may be used alone or in combination of two or more of them.

Furthermore, these photopolymerization initiators may be used together with known photopolymerization accelerator, sensitizer and the like, such as those of benzoic acid type or tertiary amine type including ethyl p-dimethylaminobenzoate, isoamyl p-dimethylaminobenzoate, 2-dimethylaminoethyl benzoate and the like.

Ingredient (D)

In the case where the photosensitive resin composition of the present invention is used as a photoresist ink, it is preferable that a binder resin having a carboxyl group is further added as ingredient (D) to the composition. This ingredient (D) exhibits a function of reducing tackiness of the surface of a predried film of the photosensitive resin composition of aqueous emulsion type of the present invention, thereby preventing the photosensitive resin composition from stain a phototool artwork or the like, when the phototool artwork or the like is directly attached as well as when it is used in off-contact mode. The ingredient also functions to improve adhesion, film strength and the like of a resist to be formed. Of course, the ingredient (D) may be incorporated, in the application other than a photoresist ink, for example in a photosensitive resin composition for manufacturing screen printing stencils.

To fully exhibit such functions, the amount of the carboxyl groups in the binder resin as ingredient (D) is preferably within the range of 20–300 mgKOH/g, particularly 40–250 mgKOH/g as acid value.

In the above ranges, the photosensitive resin composition of the present invention when used as a photosolder resist has an excellent developing property with a dilute aqueous alkaline solution in a short time and makes it possible to form a good resist pattern whose exposed and cured portion shows an excellent resistance to a dilute aqueous alkaline solution. When the photosensitive resin composition of the present invention is used as a photoetching resist ink, a good resistance to etching solution can be achieved.

The binder resin as ingredient (D) can be allowed to be carboxyl groups neutralized with an organic basic compound such as alkanolamine or an inorganic basic compound such as alkaline metal hydroxide and ammonia as long as the aim of the present invention are achieved.

The binder resin as ingredient (D) preferably has an average molecular weight in the range of 4000–250000, particularly 4000–150000 in consideration of the balance between performances such as developing property, adhesion of a resist to be formed and strength of a coating film.

Typical examples of such ingredient (D), binder resin, are as follows:

(D1) Copolymers of an ethylenically unsaturated monomer component having at least one carboxyl group, such as (meth)acrylc acid, cinnamic acid, fumaric acid, itaconic acid, crotonic acid and maleic acid, and an ethylenically unsaturated monomer component copolymerizable therewith.

The copolymerizable ethylenically unsaturated monomer component is exemplified by (meth)acrylate type unsaturated monomers [linear, branched or alicyclic (meth)acrylates such as methyl (meth)acrylate, ethyl (meth)acrylate, isobutyl (meth)acrylate and cyclohexyl (meth)acrylate]; ethylene glycol type (meth)acrylates such as hydroxyethyl (meth)acrylate, methoxyethyl (meth)acrylate and ethoxyethyl (meth)acrylate, propylene glycol type (meth) acrylates and butylene glycol type mono(meth)acrylates; glycerol mono(meth)acrylate and the like; (meth)acrylamide type unsaturated monomers such as (meth)acrylamide and N-methyl(meth)acrylamide; N-substituted maleimides such as N-phenylmaleimide and N-cyclohexylmaleimide; styrene, α-methylstyrene, vinyl ether, vinylpyrrolidone and (meth)acrylonitrile.

(D2) Binder resin having a photopolymerizable unsaturated group and also having a carboxyl group (hereafter referred to as "photosensitive binder resin having a carboxyl group") is also an example of ingredient (D).

The advantage of using such photosensitive binder resin (D2) having a carboxyl group is that exposure sensitivity is greatly improved and that a resist film formed becomes tougher one and therefore becomes resistant to peeling caused by external forces such as friction and can exhibit steady performance.

An example of such a photopolymerizable unsaturated group includes photopolymerizable groups such as a (meth)acryloyl group and a vinyl group. When a binder resin is caused to have this type of unsaturated group, the quantity of the unsaturated group is preferably about 0.01–10 mole/Kg (binder resin), and particularly preferably 0.1–5 mole/Kg. It is desirable that the acid value and weight average molecular weight may range the same as those for binder resins having no photopolymerizable unsaturated group.

An example of a base resin constituting the fundamental backbone of the photosensitive binder resin (D2) having a carboxyl group includes acrylic resins, styrene-maleic acid resins, epoxy resins, polyester resins, polyether resins, alkyd resins, fluoro resins, silicone resins, carboxyl-modified cellulose, urethane resins and modified resin composed of two or more of them.

Typical examples of photosensitive binder resin (D2) having a carboxyl group are as follows:

(D2-1) Photosensitive binder resin having a carboxyl group obtained by adding an ethylenically unsaturated monocarboxylic acid (for example, (meth)acrylic acid) and an unsaturated or saturated polybasic acid anhydride (for example, phthalic anhydride and tetrahydrophthalic anhydride) to a polyfunctional epoxy compound having at least two epoxy groups (for example, novolak type epoxy resin and bisphenol A type epoxy resin).

(D2-2) Photosensitive binder resin having a carboxyl group obtained by reacting a compound having a photoreactive ethylenically unsaturated group and one hydroxyl group in its molecule (for example, 2-hydroxyethyl (meth)acrylate and 2-hydroxypropyl (meth)acrylate) with a copolymer of an unsaturated polybasic acid anhydride (for example, maleic anhydride) and an aromatic hydrocarbon having a vinyl group (for example, styrene) or vinyl alkyl ether.

(D2-3) Photosensitive binder resin having a carboxyl group obtained by reacting some of the carboxyl groups in the copolymer composed of an ethylenically unsaturated monomer having no carboxyl group (for example, alkyl (meth)acrylate, hydroxyethyl (meth)acrylate and styrene) and an ethylenically unsaturated monomer having a carboxyl group (for example, (meth)acrylic acid, maleic acid, crotonic acid and itaconic acid) with an ethylenically unsaturated compound having only one epoxy group (for example, glycidyl (meth)acrylate and (3,4-epoxycyclohexyl)methyl (meth)acrylate).

(D2-4) Photosensitive binder resin having a carboxyl group obtained by reacting an ethylenically unsaturated monocarboxylic acid (for example, (meth)acrylic acid) and a saturated or unsaturated polybasic acid anhydride (for example, phthalic acid and tetrahydrophthalic anhydride) to a polymer or copolymer containing an ethylenically unsaturated monomer having an epoxy group (for example, glycidyl (meth)acrylate and (3,4-epoxycyclohexyl)methyl (meth)acrylate) as a polymerized unit.

(D2-5) Photosensitive binder resin having a carboxyl group obtained by reacting some of the carboxyl groups of a cellulose derivative having a carboxyl group (for example, hydroxypropylmethylcellulose phthalate and hydroxypropylmethylcellulose acetate succinate) with an ethylenically unsaturated compound having only one epoxy group (for example, glycidyl (meth)acrylate and (3,4-epoxycyclohexyl)methyl (meth)acrylate).

(D2-6) Photosensitive binder resin having a carboxyl group obtained by reacting an ethylenically unsaturated compound having only one epoxy group (for example, glycidyl (meth)acrylate and (3,4-epoxycyclohexyl)methyl (meth)acrylate) to a cellulose derivative having a carboxyl group (for example, hydroxypropylmethylcellulose phthalate and hydroxypropylmethylcellulose acetate succinate) and then further reacting a saturated or unsaturated polybasic acid anhydride (for example, phthalic acid and tetrahydrophthalic anhydride).

One kind or two or more kinds of the aforementioned binder resin as ingredient (D), is/are selected and incorporated, forming the photosensitive resin composition of the present invention.

By containing a binder resin having a carboxyl group as ingredient (D), a photoresist ink or a photo sensitive resin composition for manufacturing screen printing stencils made up of a photosensitive resin composition of the present invention may provide a cured film excellent in film strength and in resistance to a dilute aqueous alkaline solution with more stability and also may provide a cured film having high sensitivity and excellent water resistance and excellent solvent resistance. Therefore, the photoresist ink or photosensitive resin composition can yield a screen printing stencil with durability, and is desirable as a photoresist ink for manufacturing printed wiring boards, such as etching resist ink, plating resist ink, solder resist ink and marking ink, a photoresist ink for carving gravure rolls, an ink for manufacturing color filter pixels and an ink for manufacturing color filter protective coatings.

Ingredient (E)

When the photosensitive resin composition is used as a photoresist ink, an epoxy compound having two or more epoxy groups per molecule may further be incorporated optionally as ingredient (E). Of course, this epoxy compound may be added for applications other than the photoresist ink.

The incorporation of ingredient (E) can make a cured film formed after exposure and development have improved chemical resistance, solvent resistance, acid resistance and electrical corrosion resistance and have high hardness through post-baking. This characteristic is particularly useful especially in the case of using the composition of the present invention as an ink for forming a permanent film such as photosolder resist ink, ink for manufacturing color filter pixels and ink for manufacturing color filter protective coatings.

The aforesaid ingredient (E) is exemplified by an epoxy compound slightly soluble in a solvent, a general purpose epoxy compound soluble in a solvent, and the like. Their specific examples may include phenol novolak-type epoxy resin, cresol novolak-type epoxy resin, bisphenol A-type epoxy resin, bisphenol A-novolak-type epoxy resin, bisphenol F-type epoxy resin, triglycidyl isocyanurate, "YX 4000" manufactured by Yuka-Shell Epoxy Co., Ltd., sorbitol polyglycidyl ether, N-glycidyl-type epoxy resin, alicyclic-type epoxy resin (e.g., "EHPE-3150" manufactured by Daicel Chemical Industries, Ltd.), polyol polyglycidyl ether compounds, glycidyl ester compounds, N-glycidyl-type epoxy resin, tris(hydroxyphenyl)methane-based polyfunctional epoxy resin (e.g., "EPPN-502H" manufactured by NIPPON KAYAKU Co., Ltd., "TACTIX-742" and "XD-9053" manufactured by Dow Chemical Co., Ltd.), hydrogenated bisphenol A-type epoxy resin and vinyl-polymerized polymers having an epoxy group such as dicyclopentadiene-phenol-type epoxy resin, naphthalene-type epoxy resin and polyglycidyl (meth)acrylate. These may be used alone or in combination. Particularly preferred are triglycidyl isocyanurate, "YX 4000" manufactured by Yuka-Shell Epoxy Co., Ltd., phenol novolak-type epoxy resin, cresol novolak-type epoxy resin, bisphenol A-type epoxy resin, bisphenol A-novolak-type epoxy resin, and the like. Ingredient (E) may be emulsified and dispersed in advance in the form of an aqueous liquid and may, alternatively, be of self-emulsifying type. When such ingredient (E) is incorporated, one kind or two or more kinds thereof can be selected and used.

Ingredient (F)

Furthermore, for the purpose, for example, of improvement of storage stability and adjustment of exposure sensitivity of the photosensitive resin composition of aqueous emulsion type, a water-soluble photosensitive resin, such as polyvinyl alcohol type polymers having a styrylpyridinium or styrylquinolinium group and polyvinyl alcohol-based polymers to which N-methylol(meth)acrylamide has been added, may be added to the photosensitive resin composition of the present invention.

Moreover, additives conventionally used for photosensitive resin compositions such as photoresist may be optionally added to the photosensitive resin composition of the present invention. Such additives include wax emulsions; solvents such as organic ones which are added in a small amount to achieve a reduction of problems of industrial safety and health, environmental pollution, fire control and the like, which is a goal of the present invention, (for example, solvents easily soluble in water, such as alcohols and Cellosolve, and organic solvents slightly soluble or insoluble in water such as acetates and aromatic hydrocarbons); leveling agents such as silicone, (meth) acrylate copolymers and fluorine-type surfactants; polymerization inhibitors such as hydroquinone, hydroquinone monomethyl ether, pyrogallol, tert-butylcatechol and phenothiazine; halation repellants, defoamers and antioxidants; fibers or powders of glass or metal, which are used as a filler; silica, alumina white, clay, talc, barium carbonate and barium sulfate which are used as an extender; zinc white, white lead, chrome yellow, minium, ultramarine blue, iron blue, titanium oxide, zinc chromate, iron oxide red and carbon black, which are used as an inorganic coloring pigment; Brilliant Carmine 6B, Permanent Red R, Benzidine Yellow, Lake Red C and Phthalocyanine Blue, which are used as an organic coloring pigment; leuko chromophoric dyes; fading monoazo disperse dyes such as UV Blue 236 and POLYESTER BLUE GL-SF; various additives such as dyes, natural or synthesized rubber powder, and surfactants or macromolecule dispersants for improving dispersion stability.

Incorporating Amount

An incorporating amount of each ingredient is not particularly limited and each of the ingredients may be incorporated in an appropriate proportion depending upon application. The followings are examples of preferable proportion of each ingredient in a photoresist ink and a photosensitive resin composition for manufacturing screen printing stencils.

In the Case of Use as a Photoresist Ink

The incorporating amount of ingredient (B) is preferably 0.1–1000 parts by weight, particularly 1–500 parts by weight, per 100 parts by weight of a solid in ingredient (A). The most suitable amount is 10–300 parts by weight. In such ranges, a cured film obtained from the photosensitive resin composition of aqueous emulsion type has excellent water and solvent resistances.

The incorporating amount of ingredient (C) is preferably 0.1–50 parts by weight, particularly 3–30 parts by weight, per 100 parts by weight of the total amount of ingredients (B) and (D) and a solid in ingredient (A). The most suitable amount is 0.5–20 parts by weight. In such ranges, the photosensitive resin composition of aqueous emulsion type is superior especially in exposure sensitivity and cured film therefrom has sufficient water and solvent resistances.

When ingredient (D) is incorporated, the incorporating amount thereof is preferably 10–1000 parts by weight, particularly 10–500 parts by weight, per 100 parts by weight of a solid in ingredient (A). The most suitable amount is 50–300 parts by weight. In such ranges, the photosensitive resin composition of aqueous emulsion type is excellent in exposure sensitivity and developability with a dilute aqueous alkaline solution, and a cured film formed therefrom is free from the inconvenience of its brittleness, cracking or peeling. The cured film can be improved in its hardness enough to become excellent in water resistance and solvent resistance. Moreover, the cured film after predrying has a low tackiness so that the photosensitive resin composition is suitable for the so-called on-contact exposure using a phototool artwork. Furthermore, when the photosensitive resin composition of the present invention is used as a photoetching resist ink, it becomes excellent in resistance to an etching solution.

When ingredient (E) is incorporated, its incorporating amount is preferably 1–500 parts by weight, particularly 10–300 parts by weight, per 100 parts by weight of the total amount of ingredients (B) and (D) and a solid in ingredient (A). The most suitable amount is 10–100 parts by weight. In such ranges, a strong film particularly excellent in chemical resistance, solvent resistance and acid resistance is formed via post-baking. In addition, no reaction of curing of ingredient (E), the epoxy compound, occurs during the predrying, thereby ensuring a wide developing range, which means a range of predrying conditions under which developability is maintained or a range in which no thermal fog occurs and which is also called as "" predrying control range" or "predrying allowable range".

When the photosensitive resin composition of the present invention is used as a solder resist ink, the aforesaid ranges are most suitable since a solder resist can be obtained that has particularly high strength and has excellent electrical corrosion resistance and gold plating resistance.

In the case of use as a photosensitive resin composition for manufacturing screen printing stencils.

The incorporation ratio of ingredient (A) to ingredient (B) in weight ratio of active components is preferably 100:10–1000, and particularly 100:20–500. In such ranges, a cured film obtained from the photosensitive resin composition of aqueous emulsion type becomes to have excellent water resistance and solvent resistance. By the "active component" used herein is meant a solid or a material that will become a solid during the cured film formation.

The incorporation ratio of ingredient (C) to ingredient (B) in weight ratio of active components is preferably 100:0.1–50, and particularly 100:0.3–30. In such ranges, a cured film obtained from the photosensitive resin composition of aqueous emulsion type becomes to have excellent water resistance and solvent resistance.

When a powdered inactive solid is incorporated, it is desirable to incorporate the powdered inactive solid in 1–60 parts by weight, particularly 5–50 parts by weight per 100 parts by weight of the active component of the photosensitive resin composition of the present invention. When the amount of the powdered inactive solid is in such ranges, a cured film obtained from the photosensitive resin composition of the present invention is free from the inconvenience of its brittleness, cracking or peeling. The cured film can be improved in its hardness enough to become excellent in water resistance and solvent resistance.

Applications

The photosensitive resin composition of the present invention is preferably used as a photoresist ink or a photosensitive resin composition for manufacturing screen printing stencils. It can also be particularly suitably used as photoresist inks for manufacturing printed wiring boards such as an etching resist ink, plating resist ink, solder resist ink and marking ink, an ink for manufacturing color filter pixels and an ink for manufacturing color filter protective coatings. It may be used as a photosensitive resin composition for manufacturing screen printing stencils or a photoresist ink for carving gravure rolls. Furthermore, the photosensitive resin composition of the present invention can be used as the so-called dry film resist by applying it onto a support film such as a polyester film to form a film.

An example of the applications of the photosensitive resin composition of the present invention is a printed wiring board obtained by the following process. After applying a photosensitive resin composition onto a substrate on whose surface a metallic layer has been disposed and drying it, a predetermined part of the photosensitive resin composition is selectively exposed to form a cured film. The remaining non-exposed part of the photosensitive resin composition is washed away. The resulting substrate is immersed in an etching solution to subject a part of the metallic layer to etching treatment. The cured film is thereafter removed to yield a printed wiring board.

The cured film made up of the photosensitive resin composition of the present invention is used as an etching resist as described supra. Furthermore, it may be used as a cured film as it is (for example, a solder resist). In this case, the cured film remains on an end product, a printed wiring board as a permanent coating film never peeled off.

When a cured film is used as a permanent protective coating described above, a cured film formed via exposure and development can be post-baked by use of hot air heating, electromagnetic induction heating, hot press, far infrared radiation drying or the like, or be post-UV cured with ultraviolet irradiation to be improved in its strength, hardness, chemical resistance and so on, which are particularly important as physical properties of permanent protective coatings.

In these cases, the substrate on which a cured film is to be formed may be one having a conductive circuit on its surface.

How to Use

The photosensitive resin composition of the present invention can be used by methods heretofore known.

The following is an example of how to use a photosensitive resin composition for manufacturing screen printing stencils of the present invention.

Direct method: A method wherein, for example, a screen printing stencil with a cured film having a thickness of 1–10000 $\mu$m is obtained by applying a photosensitive resin composition onto a screen made of synthetic resin such as polyester, nylon and polyethylene, synthetic resin with metal, such as nickel, deposited thereon, or stainless steel, drying, selectively exposing and then developing.

Direct-indirect method: A method wherein a screen printing stencil is obtained by the following process. A photosensitive resin composition is applied onto a releasable film such as those of polyethylene, polyvinyl chloride and polyester and then dried, yielding, for example, a film with a photosensitive layer having a thickness of 10–500 $\mu$m. Using this film, the photosensitive layer is transferred to a screen by applying in advance, or while applying, water, a photosensitive resin composition or the like, and thereafter is exposed and developed to form the screen printing stencil. This method includes simpler operations than the direct method including repetitive application of the same or similar photosensitive material onto a screen. It can also produce stencils superior in printing characteristics to those by the direct method.

Indirect method: A method wherein a screen printing stencil is obtained by selectively exposing a filmized photosensitive resin composition left on a releasable film on which the photosensitive resin was filmized, developing, and then transferring to a screen.

The photosensitive resin composition of aqueous emulsion type according to the present invention has high sensitivity and can form a cured film excellent especially in water resistance and solvent resistance. Thus, it can produce screen printing stencils of excellent durability.

Because of such characteristics, the photosensitive resin composition of the present invention is suitably used for manufacturing screen printing stencils of great thickness as well as those of ordinary thickness (the "thickness" used herein means the thickness a cured film and excludes the thickness of ascreen mesh itself.) There is noclear definition for the "great thickness", but it is defined to be a thickness of not less than 100 $\mu$m for a cured film formed on ascreen. The "ordinary thickness" is defined to be a thickness less than 100 $\mu$m.

The following description is made, as an example, on the manufacture of a screen printing stencil of great thickness by the direct method.

In the direct method, for example, a photosensitive resin composition is applied onto a screen with a bucket for great thickness and dried (particularly in the case of very great thickness, the applying and drying steps may be repeated twice or more to achieve a predetermined thickness), followed by exposure and development, thereby yielding a desired screen printing stencil of great thickness.

However, in the case of using a conventional composition obtained by incorporating a diazo resin as photocrosslinking agent to a mixture including polyvinyl alcohol and polyvinyl acetate emulsion using a photosensitive resin composition comprising a water-soluble photosensitive polymer obtained by adding N-methylol(meth)acrylamide to polyvinyl alcohol, and using a composition obtained by adding an ethylenically unsaturated compound and a photopolymerization initiator to an emulsion of polyvinyl acetate or polyvinyl alcohol having a styrylpyridinium or styrylquinolinium group, a cured film of great thickness has an insufficient exposure sensitivity or needs an excess long time exposure, and also tends to result in incomplete cure at the deep portion in the film.

Therefore, there are the following problems with the above conventional compositions. It is difficult to manufacture printing stencils because of poor image formation, poor developing property, a cured film's poor water resistance, poor solvent resistance, poor adhesion to a screen substrate, poor strength, or the like. When using a printing ink, an etching resist ink, photosensitive paste, thermosetting paste or the like, the screen printing stencil may have insufficient durability or the printed pattern may lack minuteness. For such reasons, if a film formed on a screen has a thickness of 400 μm or more, it is difficult to manufacture high-performance screen printing stencils. On the other hand, in the photosensitive resin composition of the present invention, even when a film has a great thickness, it has a high exposure sensitivity and requires a short exposure time. It is fully cured at its deep portion. The resulting cured film is excellent in water resistance, solvent resistance, adhesion to a screen substrate and strength.

Accordingly, although the photosensitive resin composition of the present invention has no upper limit for its thickness, it shows good properties as a screen printing stencil of great thickness when the thickness of a film formed on a screen mesh ranges from 100 to 10000 μm. A preferable range is 100–5000 μm. When the thickness falls within the range of 100–3000 μm, the optimum properties are obtained. In other words, the photosensitive resin composition of the present invention shows good image formability and good developing property and its cured film is excellent in water resistance and solvent resistance in spite of its great thickness. Therefore, even in a long time use, the durability of a screen printing stencil and minuteness of the printed pattern are maintained. Furthermore, when the film thickness falls within the aforesaid ranges provided that their lower limits are 400 μm, the photosensitive resin composition of the present invention exhibits great advantage beyond that of the conventional products.

EXAMPLES

The present invention will be explained with reference to the following examples about (I) a photoresist ink and (II) a photosensitive resin composition for manufacturing a screen print stencil. However, the present invention is not limited to these examples.

All the units "parts" and "%" used hereafter mean "parts by weight" and "wt %", respectively, unless otherwise stated.

In addition, "weight average molecular weight" was measured by GPC (Gel Permeation Chromatography) under the following measuring conditions.

GPC Measuring Condition

In the measurement, a THF (tetrahydrofuran) solution was prepared whose concentration of the solid of each sample was 10 mg/ml, and the measurement was carried out with the injection amount of 100 μl.
Measuring Conditions
GPC Measuring Apparatus: "SHODEX SYSTEM 11" manufactured by Showa Denko K. K.
Column: "SHODEX KF-800P", "SHODEX KF-805", "SHODEX KF-803" and "SHODEX KF-801" in series, manufactured by Showa Denko K. K.
Transfer Layer: THF
Flow Rate: 1 ml/min
Column Temperature: 45° C.
Detector: RI
Conversion: Polystyrene

Synthesis Example 1

Synthesis of Ingredient (A)

Into a glass vessel equipped with a reflux cooling tube, a dropping funnel, a thermometer, a nitrogen inlet and a stirrer, 10 g of PVA-217 (polyvinyl alcohol manufactured by Kuraray Co., Ltd., degree of polymerization: 1700, degree of saponification: 88 mole %) and 90 g of ion-exchange water were charged and dissolved on heating, followed by adjusting to pH4.0. Subsequently, 5 g of methyl methacrylate, 5 g of n-butyl acrylate and 0.02 g of n-dodecylmercaptan were added while stirring at 150 rpm. After fully replacing with nitrogen, the temperature was elevated to 80° C. Then a 1% ammonium persulfate solution was dropped to initiate polymerization, followed by the dropping of a mixture of 45 g of methyl methacrylate, 25 g of n-butyl acrylate, 20 g of isobutyl methacrylate and 0.18 g of n-dodecylmercaptan for 2 hours accompanying the dropping of 10 g of a 1% ammonium persulfate solution for 2 hours. Subsequently, an aging at that temperature for 3 hours resulted in an emulsion of a water-insoluble polymer having a hydroxyl group. To this emulsion was dissolved 5 g of N-methylolacrylamide and then were added 2 g of a 0.1% aqueous methoxyhydroquinone solution and 4 g of 5% phosphoric acid. Subsequently, the mixture was allowed to react at 80° C. for 5 hours.

After the completion of the reaction, the reaction mixture was neutralized with an aqueous sodium hydroxide solution, followed by dilution with ion-exchange water, resulting in an emulsion (A-1) of a photosensitive water-insoluble polymer with a 30% solid.

Synthesis Example 2

Synthesis of Ingredient (A)

Into a glass vessel equipped with a reflux cooling tube, a dropping funnel, a thermometer, a nitrogen inlet and a stirrer, 10 g of PVA-224 (polyvinyl alcohol manufactured by Kuraray Co., Ltd., degree of polymerization: 2400, degree of saponification: 88 mole %) and 90 g of ion-exchange water were charged and dissolved on heating, followed by adjusting to pH4.0. Subsequently, 5 g of methyl methacrylate, 5 g of n-butyl acrylate and 0.02 g of n-dodecylmercaptan were added while stirring at 150 rpm. After fully replacing with nitrogen, the temperature was elevated to 80° C. Then a 1% ammonium persulfate solution was dropped to initiate polymerization, followed by the dropping of a mixture of 50 g of methyl methacrylate, 20 g of hydroxyethyl methacrylate, 20 g of n-butyl acrylate and 0.18 g of n-dodecylmercaptan for 2 hours accompanying the dropping of 10 g of a 1% ammonium persulfate solution for 2 hours. Subsequently an aging at that temperature for 3 hours resulted in an emulsion of a water-insoluble polymer having a hydroxyl group. To this emulsion was dissolved 5 g of N-methylolacrylamide and then were added 2 g of a 0.1% aqueous methoxyhydroquinone solution and 4 g of 5% phosphoric acid. Subsequently, the mixture was allowed to react at 80° C. for 5 hours.

After the completion of the reaction, the reaction mixture was neutralized with an aqueous sodium hydroxide solution, followed by dilution with ion-exchange water, resulting in an emulsion (A-2) of a photosensitive water-insoluble polymer with a 30% solid.

Synthesis Example 3

Synthesis of Ingredient (D)

Into a four-necked flask equipped with a reflux cooling tube, a thermometer, a glass tube for nitrogen replacement and a stirrer, 20 parts of methacrylic acid, 80 parts of methyl methacrylate, 100 parts of methyl ethyl ketone and 1 part of azobisisobutyronitrile were added and then allowed to polymerize at 75° C. for 5 hours on heating under a nitrogen flow, resulting in a 50% solution (P-1) of carboxyl group-containing binder resin (a solution of an acrylic ester type copolymer corresponding to a binder resin having a carboxyl group (D1)). The resulting binder resin had a weight average molecular weight of 110000 and an acid value of 130 mgKOH/g.

Synthesis Example 4

Synthesis of Ingredient (D)

214 parts of a cresol novolak type epoxy resin (the trade name: EPICLON N-680, manufactured by Dainippon Ink and Chemicals Inc., epoxy equivalents: 214) was dissolved under heating in 60 parts of methyl ethyl ketone to obtain a mixture. Then, 74 parts of acrylic acid, 0.1 part of hydroquinone and 2.0 parts of dimethylbenzylamine were added to the mixture while blowing the air under stirring, and allowed to react at 80° C. for 24 hours in an ordinary manner. After cooling the resulting reaction solution, 136 parts of methyl ethyl ketone and 76 parts of tetrahydrophthalic anhydride were added thereto. The mixture was heated to 80° C. to react for about 10 hours under stirring, producing a 65% solution (P-2) of a photosensitive binder resin having a carboxyl group, the solution corresponding to a solution of a photosensitive binder resin (D2-1) having a carboxyl group. The resulting binder resin had a weight average molecular weight of 12000 and an acid value of 77 mgKOHg.

Synthesis Example 5

Synthesis of Ingredient (D)

150 parts of a styrene-maleic anhydride copolymer (the trade name: SMA-1000A, manufactured by Elfatochem, Inc.) was dissolved under heating in 143 parts of methyl ethyl ketone to obtain a mixture. Then, 61 parts of 2-hydroxyethyl acrylate, 0.1 part of hydroquinone and 3.0 parts of dimethylbenzylamine were added to the mixture while blowing the air under stirring, and allowed to react at 80° C. for 12 hours in an ordinary manner. To the resulting reaction solution, 28 parts of n-butanol was further added and allowed to react for additional about 24 hours, producing a 60% solution (P-3) of a photosensitive binder resin having a carboxyl group, the solution corresponding to a solution of a photosensitive binder resin (D2–2) having a carboxyl group. The resulting binder resin had a weight average molecular weight of 7500 and an acid value of 156 mgKOH/g.

Synthesis Example 6

Synthesis of Ingredient (D)

Into a four-necked flask equipped with a reflux cooling tube, a thermometer, a glass tube for nitrogen replacement and a stirrer, 20 parts of methacrylic acid, 80 parts of methyl methacrylate, 100 parts of methyl ethyl ketone, 0.5 parts of laurylmercaptan and 4 parts of azobisisobutyronitrile were added and then allowed to polymerize at 75° C. for 5 hours on heating under a nitrogen flow, resulting in a 50% copolymer solution.

To the above 50% copolymer solution were added 0.05 parts of hydroquinone, 15 parts of glycidyl methacrylate and 2.0 parts of dimethylbenzylamine, and then addition polymerization was conducted at 80° C. for 24 hours while blowing the air. Subsequently, 13 parts of methyl ethyl ketone was added to produce a 50% solution (P-4) of a photosensitive binder resin having a carboxyl group, the solution corresponding to a solution of a photosensitive binder resin (D2-3) having a carboxyl group. The resulting binder resin had a weight average molecular weight of 15000 and an acid value of 62 mgKOH/g.

Synthesis Example 7

Synthesis of Ingredient (D)

Into a four-necked flask equipped with a reflux cooling tube, a thermometer, a glass tube for nitrogen replacement and a stirrer, 70 parts of glycidyl methacrylate, 10 parts of methyl methacrylate, 20 parts of tert-butyl methacrylate, 100 parts of methyl ethyl ketone, 0.5 part of laurylmercaptan and 3 parts of azobisisobutyronitrile were added and then allowed to polymerize at 75° C. for 5 hours on heating under a nitrogen flow, resulting in a 50% copolymer solution.

To the above 50% copolymer solution were added 0.05 part of hydroquinone, 37 parts of acrylic acid and 2.0 parts of dimethylbenzylamine, and then addition polymerization was conducted at 80° C. for 24 hours while blowing the air. Subsequently, 38 parts of tetrahydrophthalic anhydride and 73 parts of methyl ethyl ketone were added and allowed to react at 80° C. for 10 hours to produce a 50% solution (P-5) of a photosensitive binder resin having a carboxyl group, the solution corresponding to a solution of a photosensitive binder resin (D2-4) having a carboxyl group.

The resulting binder resin had a weight average molecular weight of 22000 and an acid value of 80 mgKOH/g.

Synthesis Example 8

Synthesis of Ingredient (D)

Into a four-necked flask equipped with a reflux cooling tube, a thermometer, a glass tube for nitrogen replacement and a stirrer, 20 parts of methacrylic acid, 80 parts of methyl methacrylate, 100 parts of propylene glycol monomethyl ether acetate and 0.5 parts of azobisisobutyronitrile were added and then allowed to polymerize at 75° C. for 5 hours on heating under a nitrogen flow, thereby resulting in a 50% solution (P'-1) of carboxyl group-containing binder resin (a solution of an acrylic ester type copolymer corresponding to a binder resin having a carboxyl group (D1)). The resulting binder resin had a weight average molecular weight of 90000 and an acid value of 130 mgKOH/g.

Synthesis Example 9

Synthesis of Ingredient (D)

150 parts of a styrene-maleic anhydride copolymer (the trade name: SMA-1000A, manufactured by Elfatochem, Inc.) was dissolved under heating in 143 parts of propylene glycol monomethyl ether acetate to obtain a mixture. Then, 51 parts of 2-hydroxyethyl acrylate, 0.1 part of hydroquinone and 3.0 parts of dimethylbenzylamine were added while blowing the air under stirring, and allowed to react at 80° C. for 12 hours in an ordinary manner. To the resulting reaction solution, 28 parts of n-butanol was further added and allowed to react for additional about 24 hours to produce a 60% solution (P'-2) of a photosensitive binder resin.

The resulting binder resin had a weight average molecular weight of 7500 and an acid value of 156 mgKOH/g.

Synthesis Example 10

Synthesis of Ingredient (D)

Into a four-necked flask equipped with a reflux cooling tube, a thermometer, a glass tube for nitrogen replacement and a stirrer, 20 parts of methacrylic acid, 80 parts of methyl methacrylate, 100 parts of propylene glycol monomethyl ether acetate, 0.5 parts of laurylmercaptan and 2 parts of azobisdimethyvaleronitrile were added and then allowed to polymerize at 110° C. for 5 hours on heating under a nitrogen flow, resulting in a 50% copolymer solution.

To the above 50% copolymer solution were added 0.05 parts of hydroquinone, 15 parts of glycidyl methacrylate and 2.0 parts of dimethylbenzylamine, and then addition polymerization was conducted at 80° C. for 24 hours while blowing the air. Subsequently, 11 parts of propylene glycol monomethyl ether acetate was added to produce a 50% solution (P'-3) of a photosensitive binder resin.

The resulting binder resin had a weight average molecular weight of 18000 and an acid value of 62 mgKOH/g.

Reference Production Example 1

In 1000 g of water was dissolved 200 g of partially saponified polyvinyl acetate with a degree of saponification of 88% (the trade name: Gohsenol GH-17, manufactured by Nippon Synthetic Chemical Industry Co., Ltd., degree of polymerization: 1700).

In this aqueous solution, 40 g of N-methylol acrylamide was dissolved and then 2 g of a 0.1% aqueous methoxyhydroquinone solution, 3 g of 8% phosphoric acid was added thereto, followed by a reaction at 60° C. for 20 hours. After the completion of the reaction, the resulting mixture was neutralized with a 5% aqueous sodium hydroxide solution and water was added so that the total weight became 1500 g, resulting in a 15% aqueous solution (F-1) of an N-methylol acrylamide adduct of polyvinyl alcohol.

Examples I-1 to I-20

As for each of Examples I-1 to I-20, a photosensitive resin composition of aqueous emulsion type was prepared in the following manner. A mixture resulting from incorporating the ingredients in a composition given in Table 1 or 2 was stirred to mix. The resulting mixture was fully dispersed with a homomixer and then heated to a liquid temperature of 65° C. Finally, organic solvent components were removed under air blowing.

Comparative Examples I-1 to I-6

As for each of Comparative examples I-1 to I-6, a photosensitive resin composition was prepared in the following manners. A mixture resulting from incorporating the ingredients in a composition given in Table 1 or 2 was stirred to mix for Comparative examples I-1 to I-3 or was fully kneaded with three rolls for Comparative examples I-4 to I-6.

TABLE 1

Photoetching resist ink

| | | Examples | | | | | | | | | | Comparative Examples | | |
|---|---|---|---|---|---|---|---|---|---|---|---|---|---|---|
| | | I-1 | I-2 | I-3 | I-4 | I-5 | I-6 | I-7 | I-8 | I-9 | I-10 | I-1 | I-2 | I-3 |
| Ingredient(A) | A-1 | 80 | | 80 | | 80 | | 80 | | 80 | | | | |
| | A-2 | | 80 | | 80 | | 80 | | 80 | | 80 | | | |
| Ingredient(D) | P-1 | 400 | 400 | | | | | | | | | | | |
| | P-2 | | | 400 | 400 | | | | | | | | | |
| | P-3 | | | | | 330 | 330 | | | | | | | |
| | P-4 | | | | | | | 400 | 400 | | | | | |
| | P-5 | | | | | | | | | 400 | 400 | | | |
| | P'-1 | | | | | | | | | | | 444 | | |
| | P'-2 | | | | | | | | | | | | 370 | |
| | P'-3 | | | | | | | | | | | | | 370 |
| Ingredient (B) | Dipentaerythritol hexaacrylate | | | | | | | | | | | | | |
| | Aronix M-101*1) | 60 | 60 | 60 | 60 | 60 | 60 | 60 | 60 | 60 | 60 | 60 | 60 | 60 |
| | Aronix M-309*2) | 60 | 60 | 60 | 60 | 60 | 60 | 60 | 60 | 60 | 60 | 60 | 60 | 60 |
| Ingredient (C) | Irgacure907*3) | 30 | 30 | 30 | 30 | 30 | 30 | 30 | 30 | 30 | 30 | 30 | 30 | 30 |
| | 2,4-Diisopropyl-thioxanthone Kayacure DETX*4) | 5 | 5 | 5 | 5 | 5 | 5 | 5 | 5 | 5 | 5 | 5 | 5 | 5 |
| Ingredient (E) | YX 4000*5) | | | | | | | | | | | | | |
| Pigment, etc. | Epicron N-680*6) | | | | | | | | | | | | | |
| | Silica (Average particle diameter 1 μm) | | | | | | | | | | | | | |
| | Barium sulfate | | | | | | | | | | | | | |
| | Victoria Blue BOH*7) | 5 | 5 | 5 | 5 | 5 | 5 | 5 | 5 | 5 | 5 | 5 | 5 | 5 |
| | Phthalocyanine Green | | | | | | | | | | | | | |
| Solvent | Water | 330 | 330 | 330 | 330 | 330 | 330 | 330 | 330 | 330 | 330 | | | |
| | Carbitol cetate | | | | | | | | | | | 163 | 235 | 235 |
| | Hydroquinone | 2 | 2 | 2 | 2 | 2 | 2 | 2 | 2 | 2 | 2 | 2 | 2 | 2 |
| | Dicyandiamide | 0.5 | 0.5 | 0.5 | 0.5 | 0.5 | 0.5 | 0.5 | 0.5 | 0.5 | 0.5 | 0.5 | 0.5 | 0.5 |
| | Modaflow*8) | | | | | | | | | | | | | |

TABLE 1-continued

Photoetching resist ink

| | | Examples | | | | | | | | | | Comparative Examples | | |
|---|---|---|---|---|---|---|---|---|---|---|---|---|---|---|
| | | I-1 | I-2 | I-3 | I-4 | I-5 | I-6 | I-7 | I-8 | I-9 | I-10 | I-1 | I-2 | I-3 |
| Epoxy curing agent | Melamine | | | | | | | | | | | | | |

TABLE 2

Photosolder resist ink

| | | Examples | | | | | | | | | | Comparative Examples | | |
|---|---|---|---|---|---|---|---|---|---|---|---|---|---|---|
| | | I-11 | I-12 | I-13 | I-14 | I-15 | I-16 | I-17 | I-18 | I-19 | I-20 | I-4 | I-5 | I-6 |
| Ingredient(A) | A-1 | 120 | | 120 | | 120 | | 120 | | 120 | | | | |
| | A-2 | | 120 | | 120 | | 120 | | 120 | | 120 | | | |
| Ingredient(D) | P-1 | 480 | 480 | | | | | | | | | | | |
| | P-2 | | | 480 | 480 | | | | | | | | | |
| | P-3 | | | | | 370 | 370 | | | | | | | |
| | P-4 | | | | | | | 480 | 480 | | | | | |
| | P-5 | | | | | | | | | 480 | 480 | | | |
| | P-1 | | | | | | | | | | | 636 | | |
| | P-2 | | | | | | | | | | | | 530 | |
| | P-3 | | | | | | | | | | | | | 530 |
| Ingredient (B) | Dipentaerythritol hexaacrylate | 42 | 42 | 42 | 42 | 42 | 42 | 42 | 42 | 42 | 42 | 42 | 42 | 42 |
| | Aronix M-101[*1)] | | | | | | | | | | | | | |
| | Aronix M-309[*2)] | | | | | | | | | | | | | |
| Ingredient (C) | Irgacure907[*3)] | 36 | 36 | 36 | 36 | 36 | 36 | 36 | 36 | 36 | 36 | 36 | 36 | 36 |
| | 2,4-Diisopropyl-thioxanthone Kayacure DETX[*4)] | 4 | 4 | 4 | 4 | 4 | 4 | 4 | 4 | 4 | 4 | 4 | 4 | 4 |
| Ingredient (E) | YX 4000[*5)] | 80 | | 80 | | 80 | | 80 | | 80 | | 80 | 80 | |
| | Epicron N-680[*6)] | | 100 | | 100 | | 100 | | 100 | | 100 | | | 100 |
| Pigment, etc. | Silica (Average particle diameter 1 μm) | 84 | 84 | 84 | 84 | 84 | 84 | 84 | 84 | 84 | 84 | 84 | 84 | 84 |
| | Barium sulfate | 126 | 126 | 126 | 126 | 126 | 126 | 126 | 126 | 126 | 126 | 126 | 126 | 126 |
| | Victoria Blue BOH[*7)] | | | | | | | | | | | | | |
| | Phthalocyanine Green | 4 | 4 | 4 | 4 | 4 | 4 | 4 | 4 | 4 | 4 | 4 | 4 | 4 |
| Solvent | Water | 576 | 596 | 576 | 596 | 558 | 578 | 576 | 596 | 576 | 596 | | | |
| | Carbitol cetate | | | | | | | | | | | 392 | 498 | 518 |
| | Hydroquinone | | | | | | | | | | | | | |
| | Dicyandiamide | | | | | | | | | | | | | |
| | Modaflow[*8)] | | | | | | | | | | | 8 | 8 | 8 |
| Epoxy curing agent | Melamine | 8 | 8 | 8 | 8 | 8 | 8 | 8 | 8 | 8 | 8 | 8 | 8 | 8 |

In Tables 1 and 2,
1) Phenol-modified monofunctional acrylate manufactured by Toagosei Co., Ltd.
2) Trimethylolpropane triacrylate manufactured by Toagosei Co., Ltd.
3) Photopolymerization initiator manufactured by Ciba-Geigy Corp.
4) Photopolymerization initiator manufactured by Nippon Kayaku Co., Ltd.
5) Epoxy compound with an epoxy equivalent of 195 manufacture by Yuka-Shell Epoxy Co., Ltd.
6) Epoxy resin of cresol novolak type with an epoxy equivalent of 214 manufactured by Dainippon Ink &Chemicals, Inc.
7) Organic dye manufactured by Hodogaya Chemical Co., Ltd.
8) Leveling agent manufactured by Monsanto Company For photosensitive resin compositions of Examples I-1 to I-10 and Comparative examples I-1 to I-3, results of evaluation of performance as a photoetching resist ink are shown in Table 3. The evaluation was conducted by using a resist pattern prepared by the following method. Full screen printing with a photosensitive resin composition was put on an FR-4 double-sided copper clad laminate whose substrate and copper foil are 1.6 mm and 35 μm in thickness, respectively, and then dried at a temperature of 80° C. for 15 minutes in a hot air convection type drier, yielding a predried film having a thickness of 10 μm. The predried film was exposed at 100 mJ/cm$^2$ under tight contact by using a phototool artwork, followed by development with a 1% aqueous sodium carbonate solution, yielding the aforesaid resist pattern.

[a. Drying Property]

Tackiness of the surface of a coating film after predrying was evaluated by touching with fingers. The results are indicated using the following symbols:

◎: The surface had no tackiness.
○: The surface had a little tackiness.
Δ: The surface had tackiness.
x : The surface had a significant tackiness.

[b. Exposure Sensitivity]

The number of steps of a film applied to a copper glass epoxy substrate, the number being evaluated by using a step tablet No. 2 (21 steps) manufactured by Kodak Co.

[c. Developing Property]

Developing property was evaluated based on visual observation and the results are indicated by the following symbols:

◎: The exposed portion with a cured film remains and the non-exposed portion has been removed. No portions were left undeveloped.
○: A slight indentation was found along the line on the boundary between the non-exposed portion and the exposed portion.
x : Neither the exposed portion nor the non-exposed portion was able to be removed.

[d. Pencil Hardness]

Pencil hardness was evaluated through the measurement according to JIS K5400 by using Mitsubishi Hi-uni (manufactured by Mitsubishi Pencil Co., Ltd.)

[e. Adhesion]

A resulting cured film was subjected to a self-adhesive cellophane tape peeling test by cross cutting according to JIS D0202.

[f. Resistance to Etching Solution]

The aforesaid copper clad laminate with a resist pattern was subjected to etching at 45° C. for 240 seconds in a 40 wt % aqueous ferric chloride solution. Subsequently, the presence of peeling of the cured film was observed. When no peeling was observed, it was evaluated as "good".

[g. Removing Property of Resist]

Removing property of a resist was evaluated through the measurement of a time (in second) needed to completely remove a cured film by spraying a 3% aqueous sodium hydroxide solution at 45° C. at a spray pressure of 2 kg/cm$^2$ to remove a resist away.

For the photosensitive resin compositions of Examples I-11 to I-20 and Comparative examples I-4 to 6, results of evaluation of performance as a photosolder resist ink are shown in Table 4. The evaluation was conducted using a resist pattern prepared by the following method. Full screen printing with a photosensitive resin composition was put on an FR-4 double-sided copper clad laminate whose substrate and copper foil are 1.6 mm and 35 μm in thickness, respectively, and then predried at 80° C. for 30 minutes, forming a predried film having a thickness of 20 μm. The predried film was exposed at 150 mJ/cm$^2$ under tight contact by using a phototool artwork, followed by development with a 1% aqueous sodium carbonate solution and additional post-baking at 150° C. for 30 minutes, yielding the aforesaid resist pattern.

Furthermore, (a) drying property, (b) exposure sensitivity, (c) developing property, (d) pencil hardness and (e) adhesion were evaluated in the same manners as those in Example I-1, but (h) heat resistance in soldering was evaluated in the following manner.

[h. Heat Resistance in Soldering]

After the application of water-soluble flux, the specimen was immersed in a molten solder bath at 260° C. for 15 seconds and then washed with water. After three times repetition of this cycle, the degree of discoloration of the surface was observed and evaluated as follows:

x : Significant discoloration was found.
○: Slight discoloration was found.
◎: No abnormalities were found.

Subsequently, by the self-adhesive cellophane tape peeling test by cross cutting according to JIS D0202, the adhesion of films was evaluated as follows:

x : Swelling or peeling of a resist occurred before the cross cut test.
○: The cross cut portion was partially peeled during tape peeling.
◎: No peeling occurred in the cross cut portion.

TABLE 3

|  | Examples | | | | | | | | | | Comparative Examples | | |
| --- | --- | --- | --- | --- | --- | --- | --- | --- | --- | --- | --- | --- | --- |
|  | I-1 | I-2 | I-3 | I-4 | I-5 | I-6 | I-7 | I-8 | I-9 | I-10 | I-1 | I-2 | I-3 |
| a. Drying property | ◎ | ◎ | ◎ | ◎ | ◎ | ◎ | ◎ | ◎ | ◎ | ◎ | ◎ | ◎ | ◎ |
| b. Exposure sensitivity | 6 | 6 | 6 | 6 | 6 | 6 | 6 | 6 | 6 | 6 | 6 | 6 | 6 |
| c. Developing property | ◎ | ◎ | ◎ | ◎ | ◎ | ◎ | ◎ | ◎ | ◎ | ◎ | ○ | ○ | ○ |
| d. Pencil hardness | 4H | 4H | 4H | 4H | 4H | 4H | 4H | 4H | 4H | 4H | 4H | 4H | 4H |
| e. Adhesion | 100/100 | 100/100 | 100/100 | 100/100 | 100/100 | 100/100 | 100/100 | 100/100 | 100/100 | 100/100 | 100/100 | 100/100 | 100/100 |
| f. Resistance to etching solution | Good | Good | Good | Good | Good | Good | Good | Good | Good | Good | Good | Good | Good |
| g. Removing property of resist | 46 | 48 | 55 | 57 | 40 | 41 | 51 | 53 | 48 | 49 | 62 | 60 | 68 |

TABLE 4

| | Examples | | | | | | | | | | Comparative Examples | | |
|---|---|---|---|---|---|---|---|---|---|---|---|---|---|
| | I-11 | I-12 | I-13 | I-14 | I-15 | I-16 | I-17 | I-18 | I-19 | I-20 | I-4 | I-5 | I-6 |
| a. Drying property | ⊚ | ⊚ | ⊚ | ⊚ | ⊚ | ⊚ | ⊚ | ⊚ | ⊚ | ⊚ | ⊚ | ⊚ | ⊚ |
| b. Exposure sensitivity | 8 | 8 | 8 | 8 | 8 | 8 | 8 | 8 | 8 | 8 | 8 | 8 | 8 |
| c. Developing property | ⊚ | ⊚ | ⊚ | ⊚ | ⊚ | ⊚ | ⊚ | ⊚ | ⊚ | ⊚ | ○ | ○ | ○ |
| d. Pencil hardness | 5H | 5H | 5H | 5H | 5H | 5H | 5H | 5H | 5H | 5H | 5H | 5H | 5H |
| e. Adhesion | 100/100 | 100/100 | 100/100 | 100/100 | 100/100 | 100/100 | 100/100 | 100/100 | 100/100 | 100/100 | 100/100 | 100/100 | 100/100 |
| h. Heat resistance in soldering — Surface blushing | ⊚ | ⊚ | ⊚ | ⊚ | ⊚ | ⊚ | ⊚ | ⊚ | ⊚ | ⊚ | ⊚ | ⊚ | ⊚ |
| h. Heat resistance in soldering — Adhesion | ⊚ | ⊚ | ⊚ | ⊚ | ⊚ | ⊚ | ⊚ | ⊚ | ⊚ | ⊚ | ⊚ | ⊚ | ⊚ |

The above results reveal that since the composition of the present invention is an aqueous emulsion, it can produce cured films having excellent adhesion, hardness, heat resistance and so on comparable to those achieved by a diluted alkali-developable ink in organic solvents with reducing a problem of odor, flammability and 80 on.

In other words, the composition of the present invention is a photosensitive resin composition of aqueous emulsion type that is developable with water or a dilute aqueous alkaline solution. It can be used with great effectiveness as a photoresist ink and the like without causing problems such as industrial safety and health, environmental pollution and fire control.

Furthermore, although not shown in the form of Examples, the photosensitive resin composition of aqueous emulsion type according to the present invention, which is developable with water or a dilute aqueous alkaline solution, is also excellent for use for forming a thick film resist, such as thick film plating resist and thick film solder resist, as well as use f or manufacturing screen printing stencils.

Photosensitive Resin Composition (II) for Manufacturing Screen Printing Stencils

Example II-1

15 g of benzoin isobutyl ether, 75 g of pentaerythritol triacrylate and 75 g of Aronix M-8030 (polyester acrylate manufactured by Toagosei Co., Ltd.) were added to 200 g of the photosensitive water-insoluble polymer emulsion (A-1) obtained in Synthetic example 1 under stirring and emulsified. To the emulsion were mixed 90 g of water and 6 g of Blue-FLB conc. (a blue pigment dispersed in water manufactured by Dainichiseika Colour & Chemicals Mfg. Co., Ltd.), yielding a photosensitive liquid (sample II-1).

A photosensitive film having a thickness of 80 μm including the thickness of the screen was prepared through three cycles of process comprising applying the above photosensitive liquid to 225-mesh polyester mesh fabric (yellow) with a bucket and drying it (hot-air drying at 30–40° C.). The screen photosensitive film was brought into contact with a positive film for manufacturing a printed wiring and then exposed to a 3 KW metal halide lamp (manufactured by Ushio Inc.) for 30 seconds at a distance of 1 m. Then the mask film was removed, and then the resulting specimen was immersed in water at 20° C. for 2 minutes, followed by washing with shower to remove the non-exposed portion. By drying the thus developed photosensitized board in the 45° C. hot air for 15 minutes, a screen stencil with 150 μm wiring for printed wiring was obtained.

Using this stencil, an etching resist ink (PLAS FINE PER-210B manufactured by Goo Chemical Co., Ltd.) was printed on 3000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm² to the screen printing stencil, but no removing occurred.

Example II-2

To 200 g of the photosensitive water-insoluble polymer emulsion (A-1) obtained in Synthetic example 1, a mixture of 60 g of LIGHT-ACRYLATE HOA-HH (2-acryloyloxyethylhexahydropthalic acid manufactured by Kyoeisha Yushi Kagaku Kogyo Co., Ltd.), 20 g of LIGHT-ACRYLATE PO-A (phenoxyethyl acrylate manufactured by Kyoeisha Yushi Kagaku Kogyo Co., Ltd.), 20 g of ACRYESTER TMP (trimethylolpropane trimethacrylate manufactured by Mitsubishi Rayon Co., Ltd.), 5 g of a photopolymerization initiator, Irgacure 907 (2-methyl-1-[4-(methylthio)phenyl]-2-morpholino-propan-1-one manufactured by Ciba-Geigy Corp.) and 5 g of Kayacure DETX (4-diethylthioxanthone manufactured by Nippon Kayaku Co., Ltd.) and 50 g of LMS-100 (talc manufactured by Fuji Talc Industrial Co., Ltd.) were added under stirring and emulsified. To the emulsion were mixed 80 g of water and 6 g of Blue-FLB conc. (a blue pigment dispersed in water manufactured by Dainichiseika Colour & Chemicals Mfg. Co., Ltd.), yielding a photosensitive liquid (sample 2).

A photosensitized screen board was prepared as in Example II-1 by using this photosensitive liquid (sample II-2) and the printing test was conducted. As the result, it was found that printing of 3000 pieces produced good printed pieces with no failure of image and that a screen printing stencil with excellent durability was obtained as with Example II-1.

Furthermore, the cured film was easily removed completely by spraying a 3% aqueous sodium hydroxide solution at 45° C. at a spray pressure of 2 kg/cm² to the screen printing stencil.

Example II-3

To 200 g of the photosensitive water-insoluble polymer emulsion (A-2) obtained in Synthetic Example 2, a mixture of 15 g of benzoin isobutyl ether, 75 g of pentaerythritol triacrylate and 75 g of Aronix M-8030 (manufactured by Toagosei Co., Ltd.) and 50 g of LMS-100 (talc manufactured by Fuji Talc Industrial Co., Ltd.) were added under stirring and emulsified. To the emulsion were mixed 135 g of water and 6 g of Blue-FLB conc. (a blue pigment dispersed in water manufactured by Dainichiseika Colour & Chemicals Mfg. Co., Ltd.), yielding a photosensitive liquid (sample II-3).

A photosensitized screen board was prepared as in Example II-1 by using this photosensitive liquid (sample II-3) and the printing test was conducted. As the result, it was found that printing of 3000 pieces produced good printed pieces with no failure of image and that a screen printing stencil with excellent durability was obtained as with Example II-1.

Furthermore, the cured film was tried to remove by spraying a 3% aqueous sodium hydroxide solution at 45° C. at a spray pressure of 2 kg/cm$^2$ to the screen printing stencil, but no removing occurred.

Example II-4

To 200 g of the photosensitive water-insoluble polymer emulsion (A-2) obtained in Synthetic Example 2, 50 g of LIGHT-ACRYLATE HOA-HH (2-acryloyloxyethyhexahydropthalic acid manufactured by KyoeiSha Yushi Kagaku Kogyo Co., Ltd.), 50 g of ACRYESTER TMP (trimethylolpropane trimethacrylate manufactured by Mitsubishi Rayon Co., Ltd.), 7 g of a photopolymerization initiator, Irgacure 907 (2-methyl-1-[4-(methylthio)phenyl]-2-morpholino-propan-1-one manufactured by Ciba-Geigy Corp.) and 3 g of Kayacure DETX (4-diethylthioxanthone manufactured by Nippon Kayaku Co., Ltd.) were added under stirring and emulsified. To the emulsion were mixed 30 g of water and 6 g of a violet pigment dispersed in water (manufactured by Dainichiseika Colour & Chemicals Mfg. Co., Ltd.), yielding a photosensitive liquid (sample II-4).

From this photosensitive liquid (sample II-4), a photosensitized screen board was prepared as in Example II-1 and the printing test was conducted. As the result, it was found that printing of 3000 pieces produced good printed pieces with no failure of image and that a screen printing stencil with excellent durability was obtained as with Example II-1.

Furthermore, the cured film was easily removed completely by spraying a 3% aqueous sodium hydroxide solution at 45° C. at a spray pressure of 2 kg/cm$^2$ to the screen printing stencil.

Example II-5

A photosensitive film was prepared through three cycles of process comprising applying the photosensitive liquid used in Example II-1 ((sample II-1), provided that Blue FBL was not incorporated therein) to 70-mesh polyester mesh fabric (white) with a bucket for thick films and drying it (hot-air drying at 30–40° C.). The screen photosensitive film was brought into contact with a mask film constituted of a circle 300 μm in diameter and then exposed to a 4 KW super-high pressure mercury lamp (manufactured by ORC Manufacturing Co., Ltd.) for 30 seconds at a distance of 1 m. The mask film was then removed, and subsequently the resulting specimen was immersed in water at 20° C. for 2 minutes, followed by washing with shower to remove the non-exposed portion. By drying thusly developed photosensitized board in the 45° C. hot air for 15 minutes, a screen stencil was obtained. The thickness of the cured film formed on the board was 500 μm (excluding the thickness of the screen). The resulting screen printing stencil had a pattern reproduced minutely. Using this stencil, a solder cream was printed on 1000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm$^2$ to the screen printing stencil, but no removing occurred.

Example II-6

A screen printing board was prepared in a way of Example II-5 except using the photosensitive liquid used in Example II-4 ((sample II-4), provided that the violet pigment dispersing in water was not incorporated therein.) The thickness of the cured film formed on the board was 500 μm (excluding the thickness of the screen). The resulting screen printing stencil had a pattern reproduced minutely. Using this stencil, a solder cream was printed on 1000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm$^2$ to the screen printing stencil, but no removing occurred.

Example II-7

A photosensitive film was prepared through twenty cycles of process comprising applying the photosensitive liquid used in Example II-1 ((sample II-1), provided that Blue FBL was not incorporated therein) to 70-mesh polyester mesh fabric (white) with a bucket for thick films and drying it (hot-air drying at 30–40° C.). The screen photosensitive film was brought into contact with a mask film constituted of a circle 500 μm in diameter and then exposed to a 4 KW super-high pressure mercury lamp (manufactured by ORC Manufacturing Co., Ltd.) for 120 seconds at a distance of 1 m. The mask film was then removed, and subsequently the resulting specimen was immersed in water at 20° C. for 2 minutes, followed by washing with shower to remove the non-exposed portion. By drying the thus developed photosensitized board in the 45° C. hot air for 15 minutes, a screen stencil was obtained. The thickness of the cured film formed on the board was 2000 μm (excluding the thickness of the screen). The resulting screen printing stencil had a pattern reproduced minutely. Using this stencil, a solder cream was printed on 1000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm$^2$ to the screen printing stencil, but no removing occurred.

Example II-8

A screen printing board was prepared in a way of Example II-7 except using the photosensitive liquid used in Example II-1 ((sample II-1), provided that the violet pigment dispersing in water was not incorporated therein.) The thickness of the cured film formed on the board was 2000 μm (excluding the thickness of the screen). The resulting screen printing stencil had a pattern reproduced minutely. Using this stencil, a solder cream was printed on 1000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm$^2$ to the screen printing stencil, but no removing occurred.

Example II-9

A photosensitive liquid (sample II-9) was prepared in a way of Example II-1 except mixing the ingredients of the composition used in Example II-1 with the addition of 50 g of polyvinyl acetate emulsion HA- 10 (manufactured by Clariant Polymers K.K.) Subsequently, a screen printing stencil with 150 µm wiring for printed wiring was obtained through operations the same as those in Example II-1.

Using this stencil, an etching resist ink (PLAS FINE PER-210B manufactured by Goo Chemical Co., Ltd.) was printed on 3000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm² to the screen printing stencil, but no removing occurred.

Example II-10

A photosensitive liquid (sample II-10) was prepared in a way of Example II-1 except mixing the ingredients of the composition used in Example II-1 with the addition of 50 g of a 15% aqueous solution (F-1) of the N-methylolacrylamide adduct of polyvinyl alcohol obtained in Reference Production Example 1. Subsequently, a screen stencil with 150 µm wiring for printed wiring was obtained through operations the same as those in Example II-1.

Using this stencil, an etching resist ink (PLAS FINE PER-210B manufactured by Goo Chemical Co., Ltd.) was printed on 3000 pieces of copper-laminated boards, producing good printed pieces with no failure of image. This reveals that the screen printing stencil obtained in this Example had excellent durability.

Furthermore, the cured film was tried to remove by spraying a 3% aqueous sodium hydroxide solution at 45° C. at a spray pressure of 2 kg/cm² to the screen printing stencil, but no removing occurred.

Comparative Example II-1

To 200 g of (A-1) obtained in Synthesis Example 1, 15 g of benzoin isobutyl ether was added under stirring and emulsified. To this emulsion, 6 g of Blue FLB conc. (a blue pigment dispersed in water manufactured by Dainichiseika Colour & Chemicals Mfg. Co., Ltd.), yielding a photosensitive liquid. Using this photosensitive liquid, a screen photosensitized board was prepared in the same manner as Example II-1. The resulting screen printing stencil, however, was of poor resolution. The image formed, which should inherently be a straight line, staggered along the mesh of a screen. Moreover, 1000 pieces of prints was made using this screen printing stencil, but a part of the cured film peeled.

Furthermore, the cured film was tried to remove by spraying a 3% aqueous sodium hydroxide solution at 45° C. at a spray pressure of 2 kg/cm² to the screen printing stencil, but no removing occurred.

Comparative Example II-2

Into a glass vessel equipped with a stirrer, 45 g of PVA-217 (polyvinyl alcohol manufactured by Kuraray Co., Ltd., degree of polymerization: 1700, degree of saponification: 88 mole %) and 255 g of ion-exchange water were charged and dissolved on heating. To the solution, 150 g of pentaerythritol triacrylate containing 7.5 g of benzoin isobutyl ether dissolved therein was added under stirring and emulsified. Furthermore, 300 g of polyvinyl acetate emulsion HA-10 (Clariant Polymers K.K.) was mixed and, subsequently, 3 g of a sulfate of a condensate of p-diazodiphenylamine and p-formaldehyde (diazo resin) was mixed, yielding a photosensitive liquid.

Subsequently, a screen printing stencil was prepared in a way of Example II-5 except using the above photosensitive liquid as a photosensitive liquid, changing the number of the repetitive application-drying step to five times and changing the exposure time to 10 minutes. The thickness of the cured film formed on the board was 500 µm (excluding the thickness of the screen). A solder cream was printed on copper-laminated boards using this stencil, but when print had been put on 500 pieces, a part of the cured film removed and it became impossible to produce printed products with good reproducibility.

Furthermore, the cured film was tried to remove by spraying a 3% aqueous sodium hydroxide solution at 45° C. at a spray pressure of 2 kg/cm² to the screen printing stencil, but no removing occurred.

Comparative Example II-3

The production of a screen printing stencil with a cured film 2000 µm in thickness was attempted in a way of Example II-7 except changing the number of the repetitive application-drying step to 30 times and changing the exposure time to 30 minutes from the condition adopted in Comparative Example II-2. However, the cured film peeled off from the screen mesh during the development and no image was obtained.

From the view of the above results, the photosensitive resin composition of aqueous emulsion type obtained according to the present invention has high sensitivity. Moreover, since it can produce a cured film particularly excellent in water resistance and solvent resistance, it can yield a screen printing stencil particularly excellent in durability. Furthermore, as is clear from Examples II-5 to II-8, the photosensitive resin composition of aqueous emulsion type obtained according to the present invention is excellent in developing property, resolution and durability and also has extremely higher exposure sensitivity in comparison with the conventional photosensitive compositions for manufacturing screen printing stencils. Therefore, it can easily produce a screen printing stencil with a thick film having superior physical properties.

Moreover, when a compound (b) having at least one per molecule carboxyl group and at least one per molecule photoreactive ethylenically unsaturated group is used as at least a part of ingredient (B), the resulting cured film becomes possible to be removed by dissolving with a dilute aqueous alkaline solution or the like. Therefore, the photosensitive resin composition of the present invention can be widely used as various kinds of resist inks and as, for example, a photosensitive resin composition for producing a dry film resist.

What is claimed is:

1. A photosensitive resin composition in the form of an aqueous emulsion comprising:
    (A) an emulsion of a photosensitive water-insoluble polymer, the emulsion being obtained by reacting (i) an aqueous polymer emulsion which contains a water-insoluble polymer as its main component and which contains a polymer having a hydroxyl group with (ii) an N-alkylol(meth)acrylamide;
    (B) at least one monomer having at least one photoreactive ethylenically unsaturated group;
    (C) a photopolymerization initiator; and
    (E) an epoxy compound having at least two epoxy groups per molecule.

2. A photosensitive resin composition in the form of an aqueous emulsion comprising:
    (A) an emulsion of a photosensitive water-insoluble polymer, the emulsion being obtained by reacting (i) an aqueous polymer emulsion which contains a water-insoluble polymer as its main component and which contains a polymer having a hydroxyl group with (ii) an N-alkylol(meth)acrylamide;

(B) at least one monomer having at least one photoreactive ethylenically unsaturated group; and (C) a photopolymerization initiator, wherein the component (B) comprises a monomer (b) having at least one carboxyl group and at least one photoreactive ethylenically unsaturated group in a molecule.

3. A method for producing a screen printing stencil comprising:

(I) a step of providing a photosensitive resin composition according to claim 1 or 2;

(II) a step of forming a film of the photosensitive resin composition on a releasable film;

(III) a step of selectively exposing the film to form a cured film;

(IV) a step of washing away to remove an non-exposed portion of the film; and (V) a step of transferring the resulting cured film onto a screen.

4. A method for producing a printed wiring board produced by using the photosensitive resin composition according to claim 1 or 2 comprising:

(I) a step of providing a substrate having a metallic layer formed on its surface;

(II) a step of applying the photosensitive resin composition to the surface of the substrate and then drying it;

(III) a step of selectively exposing a predetermined portion of the photosensitive resin composition which is applied to the substrate to form a cured film;

(IV) a step of washing away to remove the non-exposed portion of the photosensitive resin composition;

(V) a step of immersing the substrate in an etching solution to subject a part of the metallic layer to be etched; and (VI) a step of removing the cured film.

5. A method for producing a printed wiring board produced by using the photosensitive resin composition according to claim 1 or 2 comprising:

(I) a step of providing a substrate with a conductive circuit formed on its surface;

(II) a step of applying the photosensitive resin composition to the surface of the substrate and then drying it;

(III) a step of selectively exposing a predetermined portion of the photosensitive resin composition which is applied to the substrate to form a cured film; and (IV) a step of washing away to remove the non-exposed portion of the photosensitive resin composition.

6. A method for producing a printed wiring board according to claim 5 further comprising a step of heating the cured film to obtain a permanent protective coating.

7. A printed wiring board with a cured film on its surface, the cured film being made from the photosensitive resin composition according to claim 1 or 2.

8. A printed wiring board according to claim 7 wherein the cured film is a permanent protective coating.

* * * * *